United States Patent [19]
Yamamoto et al.

[11] Patent Number: 5,293,212
[45] Date of Patent: Mar. 8, 1994

[54] NON-VOLATILE SEMICONDUCTOR MEMORY DEVICE ALLOWING ERASE OF STORAGE DATA OF AN ARBITRARY MEMORY CELL AND METHOD OF ERASING DATA IN NON-VOLATILE SEMICONDUCTOR MEMORY DEVICE

[75] Inventors: Makoto Yamamoto; Kazuo Kobayashi, both of Hyogo, Japan

[73] Assignee: Mitsubishi Denki Kabushiki Kaisha, Tokyo, Japan

[21] Appl. No.: 829,143

[22] Filed: Jan. 31, 1992

[30] Foreign Application Priority Data

Feb. 8, 1991 [JP] Japan ................... 3-018044

[51] Int. Cl.⁵ .............................. G11C 7/00
[52] U.S. Cl. ............................ 365/218; 365/185
[58] Field of Search ............. 365/218, 185, 230.06

[56] References Cited

U.S. PATENT DOCUMENTS

| | | | |
|---|---|---|---|
| 4,451,905 | 5/1984 | Moyer | 365/185 |
| 4,698,787 | 10/1987 | Mukherjee et al. | 365/185 |
| 4,803,529 | 2/1989 | Masuoka | 365/185 |
| 4,920,512 | 4/1990 | Miyamoto | 365/185 |
| 4,949,309 | 8/1990 | Rao | 365/218 |
| 5,047,814 | 9/1991 | Hazani | 365/185 |
| 5,050,125 | 9/1991 | Momodomi | 365/185 |
| 5,105,386 | 4/1992 | Andoh | 365/185 |
| 5,122,985 | 6/1992 | Santin | 365/218 |
| 5,134,449 | 7/1992 | Gill | 365/218 |

OTHER PUBLICATIONS

IEEE Journal of Solid-State Circuits, vol. 23, No. 5 Oct. 1988, pp. 1157–1162 "An In-System Reprogrammable 32Kx8 CMOS Flash Memory", Virgil Niles Kynett et al.

*Primary Examiner*—Eugene R. LaRoche
*Assistant Examiner*—A. Zarabian
*Attorney, Agent, or Firm*—Lowe, Price, LeBlanc & Becker

[57] ABSTRACT

A flash EEPROM with each memory cell including a single transistor, structured, to erase only the data of a desired memory cell, such that a high voltage of 10V is applied to one of all the bit lines in each block, a ground potential of 0V is applied to one of all the word lines in a memory array and a positive potential is applied to the other word lines in a data erasing to cause a tunnel phenomenon between a floating gate and a drain of one memory cell in each of blocks constituting the memory array.

13 Claims, 13 Drawing Sheets

FIG. 2A

| SELECTED MEMORY CELL M22 |||
|---|---|---|
| CONTROL GATE | DRAIN | SOURCE |
| 0V | 10V | 5V (OR FLOATING) |

FIG. 2B

| NON-SELECTED MEMORY CELLS M21, M23 |||
|---|---|---|
| CONTROL GATE | DRAIN | SOURCE |
| 0V | 0V (OR FLOATING) | 5V (OR FLOATING) |

FIG. 2C

| NON-SELECTED MEMORY CELLS M12, M32 |||
|---|---|---|
| CONTROL GATE | DRAIN | SOURCE |
| 5V | 10V | 5V (OR FLOATING) |

FIG. 2D

| NON-SELECTED MEMORY CELLS M11, M13, M31, M33 |||
|---|---|---|
| CONTLOL GATE | DRAIN | SOURCE |
| 5V | 0V (OR FLOATING) | 5V (OR FLOATING) |

FIG.7

| TERMINAL CONTROL SIGNAL POTENTIAL (LEVEL) | $V_1$ | $V_2$ | $V_3$ | E | F | G | I | K |
|---|---|---|---|---|---|---|---|---|
| (a) WRITING | 5V | 12V | 12V | L | H | H | H | L |
| (b) ERASING ON BYTE BASIS | 5V | 5V | 12V | H | H | L | L | L |
| (c) TOTAL ERASING | 12V | 5V | 5V | L | L | L | L | H |
| (d) READING | 5V | 5V | 5V | L | H | H | L | H |

(IN TABLE, H DENOTES HIGH LEVEL, L DENOTES LOW LEVEL)

FIG.10A PRIOR ART

| SELECTED MEMORY CELL M22 | | |
|---|---|---|
| CONTROL GATE | DRAIN | SOURCE |
| 12V | 7V | 0V |

FIG.10B PRIOR ART

| NON-SELECTED MEMORY CELLS M21, M23 | | |
|---|---|---|
| CONTROL GATE | DRAIN | SOURCE |
| 12V | 0V | 0V |

FIG.10C PRIOR ART

| NON-SELECTED MEMORY CELLS M12, M32 | | |
|---|---|---|
| CONTROL GATE | DRAIN | SOURCE |
| 0V | 7V | 0V |

FIG.10D PRIOR ART

| NON-SELECTED MEMORY CELLS M11, M13, M31, M33 | | |
|---|---|---|
| CONTROL GATE | DRAIN | SOURCE |
| 0V | 0V | 0V |

FIG.11A  PRIOR ART

| ALL MEMORY CELLS | | |
|---|---|---|
| CONTROL GATE | DRAIN | SOURCE |
| 0V | 0V | 10V |

FIG.11B  PRIOR ART

| SELECTED MEMORY CELL M22 | | |
|---|---|---|
| CONTROL GATE | DRAIN | SOURCE |
| 5V | 2V | 0V |

FIG.11C  PRIOR ART

| NON-SELECTED MEMORY CELLS M12, M32 | | |
|---|---|---|
| CONTROL GATE | DRAIN | SOURCE |
| 0V | 2V | 0V |

FIG.11D  PRIOR ART

| NON-SELECTED MEMORY CELLS M21, M23 | | |
|---|---|---|
| CONTROL GATE | DRAIN | SOURCE |
| 5V | FLOATING | 5V |

FIG.11E  PRIOR ART

| NON SELECTED MEMORY CELLS M11, M13, M31, M33 | | |
|---|---|---|
| CONTROL GATE | DRAIN | SOURCE |
| 0V | FLOATING | 0V |

FIG. 19

|  | WE | BE | EE |
|---|---|---|---|
| (a) WRITING | H | L | L |
| (b) ERASING ON BYTE BASIS | L | H | L |
| (c) TOTAL ERASING | L | L | H |
| (d) READING | L | L | L |

FIG. 20

| SELECTED MEMORY CELL | | |
|---|---|---|
| CONTROL GATE | DRAIN | SOURCE |
| 12V | 7V | 0V |

FIG. 21

| SELECTED MEMORY CELL | | |
|---|---|---|
| CONTROL GATE | DRAIN | SOURCE |
| 5V | 2V | 0V |

NON-VOLATILE SEMICONDUCTOR MEMORY DEVICE ALLOWING ERASE OF STORAGE DATA OF AN ARBITRARY MEMORY CELL AND METHOD OF ERASING DATA IN NON-VOLATILE SEMICONDUCTOR MEMORY DEVICE

BACKGROUND OF THE INVENTION

1. Field of the Invention

The present invention relates generally to non-volatile semiconductor memory devices, and more particularly, to non-volatile semiconductor memory devices allowing exclusive erasing of storage data of a desired memory cell.

2. Description of the Background Art

Non-volatile semiconductor memory devices, differently from volatile semiconductor memory devices such as DRAM (Dynamic Random Access Memory) and SRAM (Static Type Random Access Memory), are characterized in that storage data is maintained after power is lost. PROM (Programmable Read Only Memory) is a representative of such non-volatile semiconductor memory devices. PROM is a non-volatile semiconductor memory device allowing users to write information therein. Typical of such PROM which have been already in the market are EPROM (Erasable and Electrically Programmable Read Only Memory) which data is written electrically and erased by ultra-violet light and EEPROM (Electrically Erasable and Programmable Read Only Memory) which data is erased and written electrically. FIG. 12 is a sectional view showing the structure of a memory cell in an EPROM. FIG. 13 is a sectional view showing the structure of a memory cell in an EEPROM.

With reference to FIG. 12, each memory cell in the EPROM includes a single FAMOS (Floating-gate Avalanche Injection MOS) transistor. The FAMOS transistor includes N type impurity regions 2 and 3 as a drain and a source formed at a P type substrate 1, a conductor layer 5 of polysilicon formed on P type substrate 1, with an oxide film 6 provided therebetween, to extend between N type impurity regions 2 and 3, and a conductor layer 4 formed on conductor layer 5 with an oxide film 7 provided therebetween. Conductor layers 4 and 5 are a control gate and a floating gate of the FAMOS transistor, respectively.

A high voltage is applied to drain 2 and control gate 4 in a data writing. As a result, a large channel current flows between drain 2 and source 3. The electric field in the channel between drain 2 and source 3 is so strong in the proximity of drain 2 that electrons in the channel are sufficiently accelerated to obtain high energy. Part of the high energy electrons (hot electrons) has higher energy than barrier energy of oxide film 6 provided between floating gate 5 and semiconductor substrate 1 in the direction of floating gate 5 due to the high potential of control gate 4. The part of the hot electrons reaching floating gate 5 are captured by the gate 5. Stop of the application of a high voltage to drain 2 and control gate 4 prevents the hot electrons from flowing to floating gate 5. With floating gate 5 being electrically insulated from control gate 4 and P type substrate 1 by insulation films 7 and 6, respectively, the potential energy of the hot electrons captured by floating gate 5 is lower than the potential energy of oxide films 6 and 7. As a result, the electrons once captured by floating gate 5 will stay there for a long time period.

Data "0" and "1" correspond to the capture of electrons by floating gate 5 and non-capture thereof, respectively.

The capture of the electrons by floating gate 5 impedes formation of an inversion layer to be generated between drain 2 and source 3. As a result, a threshold voltage of the memory cell after a data writing becomes higher than that before the data writing. Reading of the data, therefore, is executed by applying an appropriate positive voltage to control gate 4, thereby determining as to whether current flows between drain 2 and source 3. The appropriate voltage is set to be higher than a threshold voltage of an FAMOS transistor with no data written, that is, with no electron injected to floating gate 5 and lower than a threshold voltage of an FAMOS transistor with data written, that is, with electrons injected to floating gate 5. The FAMOS transistor constituting the memory cell conducts only when no electron is injected to floating gate 5, resulting in producing current flowing between drain 2 and source 3. Whether the storage data of the memory cell is "0" or "1" is determined by detecting the presence of a current flowing between source 3 and drain 2.

Such high energy ray as ultra-violet light is directed to the FAMOS transistor in a data erasing. The photoenergy of the ray excites the electrons captured by floating gate 5 to attain higher energy than the potential energies of oxide films 6 and 7. As a result, the electrons captured by floating gate 5 are discharged to control gate 4 or substrate 1.

A memory cell array of an EPROM includes FAMOS transistors each structured as shown in FIG. 12, these transistors are arranged in a matrix of rows and columns. Respective control gates 4 of all the FAMOS transistors arranged in the same row are connected to the same word line. Respective drains of all the FAMOS transistors arranged in the same column are connected to the same bit line. Voltages are applied to drains 2 and control gates 4 through the bit line and the word line. An application of a high voltage to one word line and one bit line selectively writes data "0" in a single memory cell having control gate 4 and drain 2 connected to the one word line and the one bit line, respectively. In a data erasing, the entire memory cell array is irradiated with ultra-violet ray, resulting in a total erasing made for the storage data of the whole message in the memory cell array.

With reference to FIG. 13, each memory cell of an EEPROM includes a single stacked gate transistor 10 and a single MOS transistor 11 formed on the same substrate. FAMOS transistor 10 includes N type impurity diffusion layers 2 and 3 as a source and a drain formed at a P type substrate 1, a control gate 4 and a floating gate 5. Floating gate 5 is formed on P type substrate 1 with an oxide film 6 provided therebetween to extend between drains 2 and 3. Control gate 4 is formed on floating gate 5 with an oxide film 7 provided therebetween. In this stacked gate transistor 10, oxide film 6 provided between floating gate 5 and substrate 1 has a thickness (200Å or more in general) in the portion corresponding a portion between source 2 and drain 3 to prevent the tunnel phenomenon and formed to be thin (about 100Å in general) in the portion corresponding to the end portion of drain 2 to cause the tunnel phenomenon. The thin portion 6b of oxide film 6 is referred to as a tunnel oxide film. On the other hand, in an stacked gate transistor (FIG. 12) for use as a memory cell in an EPROM, oxide film 6 provided between substrate 1 and floating gate 5 has an even thickness extensively (200Å or more in general) to prevent the tunnel phenomenon. Data writing and erasing of the EEPROM is carried out by using the tunnel oxide film 6b.

In a data writing, a high voltage, with drain 2 as a potential side higher, is applied to the region between drain 2 and control gate 4. As a result, a high electric field of the reverse direction to that in the data writing is generated in oxide film 6b, so that the electrons of floating gate 5 tunnel through oxide film 6b to be discharged to drain 2. The electrons captured by floating gate 5 are removed therefrom. A threshold voltage of stacked gate transistor 10 with a floating gate 5 capturing electrons is higher than that of a stacked gate transistor 10 with a floating gate 5 capturing no electron as a matter of course. Data writing and data erasing for an EEPROM is also performed by changing a threshold voltage of stacked gate transistor 10 constituting each memory. Conversely, a high voltage is applied between drain 2 and control gate 4 to make control gate 4 have a higher potential in a data writing. As a result, a high electric field with floating gate 5 as a potential side higher, is generated in tunnel oxide film 6b to cause the tunnel phenomenon. That is, hot electrons generated in the proximity of drain 2 and tunnelling through oxide film 6b are injected to floating gate 5. With no high voltage applied to the region between drain 2 and control gate 4, the electrons injected to floating gate 5 will stay in floating gate 5 for a long time period as in the case of the EPROM.

Whether the storage data of the memory cell is "0" or "1" can be determined by detecting the presence of a current flowing between drain 2 and source 3 of a memory cell having control gate 4 supplied with an appropriate potential (lower than the threshold voltage of FAMOS transistor 10 having a floating gate capturing electrons and higher than the threshold voltage of FAMOS transistor 10 having a floating gate 5 not capturing electrons).

For such data erase, data write and data read done on a memory cell basis, each memory cell is provided with an MOS transistor 11. MOS transistor 11 includes an impurity diffusion layer 2 as a source which layer is formed, together with the drain of stacked gate transistor 10, at P type substrate 1, an N type impurity diffusion layer 8 as a drain formed at P type substrate 1 and a gate electrode 9 formed on P type substrate 1 to extend between impurity diffusion layers 2 and 8. Gate electrode 9 is electrically insulated from P type substrate 1 by oxide film 6.

A memory cell array of an EEPROM includes memory cells structured as shown in FIG. 13 disposed in a matrix of rows and columns, gates 9 of MOS transistors 11 constituting all of memory cells arranged in the same row being connected to the same word line and drains 8 of MOS transistors 11 constituting all of memory cells arranged in the same column being connected to the same bit line. In a data writing, a high potential is applied to control gate 4 of each of stacked gate transistors 10 and a potential equal to or higher than a threshold voltage of MOS transistor 11 and a ground potential are applied to the one word line and the one bit line, respectively. As a result, data is written only the memory cell having gate 9 and drain 8 connected to the one word line and the one bit line, respectively. In a data erasing, control gates 4 of all the stacked gate transistors 10 are grounded and a potential equal to or higher than the threshold voltage of MOS transistor 11 and a high potential are applied to one word line and one bit line, respectively. As a result, only the data of the memory cell having gate 9 and drain 8 connected to the one word line and the one bit line, respectively, is erased. In a data reading, with said appropriate potential being applied to control gates 4 of all the stacked gate transistors 10 and a potential equal to or higher than the threshold voltage of MOS transistor 11 being applied to one word line, the presence of current flowing through one bit line is detected. As a result, only the storage data is read of the memory cell having gate 9 and drain 8 respectively connected to the one word line and the one bit line.

As described above, each memory cell of an EPROM is structured by a single transistor, while each memory cell of an EEPROM is structured by two transistors. The EPROM requiring low bit cost achieves high integration density with ease, while the EEPROM requiring high bit cost does not as a result. In operation, data erasing of the EPROM is carried out by using an ultraviolet ray, while data of the EEPROM is erased electrically. As a result, the EPROM allows the total erasing of the data of all the memory cells, while the EEPROM enables selective data erasing, for example, on a byte basis.

A flash EEPROM enabling total electrical erasing of storage data of all memory cells has drawn much attention as a non-volatile semiconductor memory device other than such EPROM and EEPROM. FIG. 14 is a diagram showing the sectional structure of each memory cell in a flash EEPROM. With reference to FIG. 14, each memory cell, similar to EPROM, is structured by a single FAMOS transistor. Unlike the FAMOS transistor constituting each memory cell of the EPROM, the present FAMOS transistor, however, generally has the thickness of an oxide film 6 provided between a floating gate 5 and a P type substrate 1 set to be as small as about 100Å to cause the tunnel phenomenon. In a data writing, a high voltage is applied to a control gate 4 and a drain 2 to generate hot electrons which will be injected to floating gate 5. In a data erasing, control gate 4 is grounded and source 3 is supplied with a high voltage. This causes the tunnel phenomenon between floating gate 5 and source 3 and thus electrons stored in floating gate 5 tunnel through oxide film 6 to be discharged to source 3. The film thickness of an oxide film 7 between control gate 4 and floating gate 5 is 200Å or more in general to prevent tunneling.

The flash EEPROM also includes a plurality of memory cells arranged in a matrix of rows and columns, with control gates 4 of FAMOS transistors constituting the respective memory cells arranged in the same row being connected to the same word line and drains 2 of FAMOS transistors constituting the memory cells arranged in the same column being connected to the same bit line. A voltage is applied to control gate 4 and drain 2 through a word line and a bit line, respectively, in the data writing and the data erasing. In the flash EEPROM, sources 3 of the FAMOS transistors each constituting each of all the memory cells are connected to a common signal line (hereinafter referred to as a source line). In the data erasing, a high voltage is applied to the source line and all the word lines are grounded. Data erasing of the flash EEPROM is simultaneously made for all the bits as a result.

FIG. 9 is a conceptual circuit diagram showing the structure of a memory array in a flash EEPROM. For the purpose of simplicity, FIG. 9 shows a memory array including memory cells arranged in a matrix of 3 rows and 3 columns. FIGS. 10A-10D are tables showing one example of the potentials on a word line, a bit line and a source line at the time of writing data in the flash EEPROM and FIG. 11A is a table showing one example of the potentials on the word line, the bit line and the source line at the time of erasing data of the flash EEPROM. FIG. 11B is a table showing one example of the potentials on the word line, the bit line and the source line at the time of reading data of the flash EERPOM.

With reference to FIG. 9, memory cells M11, M12 and M13 in the first row each have a control gate connected to a word line WL1, memory cells M21, M22 and M23 in the second row each have a control gate connected to a word line WL2 and memory cells M31, M32 and M33 in the third row each have a control gate connected to a word line WL3. Each drain of memory cells M11, M21 and M31 in the first column is connected to a bit line BL1, each drain of memory cells M12, M22 and M32 in the second column is connected to a bit line BL2 and each drain of memory cells M13, M23 and M33 in the third column is connected to a bit line BL3. Bit lines BL1, BL2 and BL3 are connected to a node D through N channel MOS transistors Q1, Q2 and Q3, respectively. Each source of all the memory cells Mij (i=1, 2, 3:j=1, 2, 3) is connected to the same node S. Node D is supplied with a high potential and a ground potential in a data writing and a data erasing, respectively. Node S is supplied with the ground potential and a high potential in the data writing and the data erasing, respectively. Transistors Q1-Q3 are provided for selecting one of bit lines BL1-BL3 supplied with the potential of node D. Transistors Q1, Q2 and Q3 is controlled by control signals C1, C2 and C3, respectively.

For writing data in memory cell M22, for example, a logical level of control signal C2 is brought to high, while the other control signals C1 and C3 are brought to a logical low level. At the same time, a high voltage of about 12V is applied to word line WL2, while the potentials on the other word lines WL1 and WL3 are set to 0V. In other words, bit line BL2 and word line WL2 are selected. As a result, the potentials of the control gate, the drain and the source of memory cell (hereinafter referred to as a selected memory cell) M22 located at the cross-over point of the selected bit line BL2 and the selected word line WL2 become 12V, 7V and 0V, respectively, as shown in FIG. 10(A). The hot electrons generated in the proximity of the drain are injected to the floating gate, in the selected memory cell M22. The potentials of the control gate, the drain and the source of each of the other memory cells M21 and M23 connected to the selected word line WL become 12V, 0V and 0V, respectively. As a result, no hot electron to be injected to the floating gate is generated in these memory cells M21 and M23 (see FIG. 10(B)).

The potentials of the control gate, the drain and the source of each of the other memory cells M12 and M32 connected to the selected bit line BL2 become 0V, 7V and 0V, respectively, as shown in FIG. 10(C). No hot electron to be injected to the floating gate is generated in these memory cells M12 and M32. The potentials of the control gate, the drain and the source of each of memory cells M11, M13, M31 and M33 having the control gate and the drain connected to non-selected word lines and non-selected bit lines become 0V, 0V and 7V, respectively as shown in FIG. 10(D). No hot electron is generated and no hot electron is injected to the floating gate in any of memory cells M11, M13, M31 and M33. As a result, data "0" is written only in the selected memory cell M22 but not in other memory cells.

In a data erasing, all of control signals C1-C3 attain a logical high level to pull the potentials on all the bit lines BL1-BL3 to approximately 0V. As a result, the potentials of the control gate, the drain and the source of each of all the memory cells Mij become 0V, 0V and 10V, respectively, as shown in FIG. 11A. The electrons are extracted from the floating gate to the source of each of all the memory cells Mij. Although non-selected bit lines can be at a floating state, they should have a potential equal to or lower than a voltage (read voltage) to be applied to the control gate for data reading, it is set approximately 0V in practice.

In a data reading, the potential of one of control signals C1-C3 and the potential of one of word lines WL1-WL3 are brought to an ordinary potential corresponding to a high level, that is, to 5V and a lower potential of about 2V, respectively, and a ground potential are applied to nodes D and S.

For reading the data from memory cell M22, for example, a logic level of control signal C2 is brought to high, while both of the logic levels of the other control signals C1 and C3 are brought to low. At the same time, 5V is applied to word line WL2. As a result, 5V, 2V and 0V are applied to the control gate, the drain and the source of the selected memory cell M22 as shown in FIG. 11B. When the selected memory cell M22 stores data of "1", memory cell M22 is turned on to cause a current to flow from node D to node S through transistor Q2, bit line BL2 and memory cell M22. With the memory cell M22 storing data of "0", memory cell M22 remains off to cause no such current.

Out of memory cells M11-M13 and M31-M33 respectively connected to 0V word lines WL1 and WL3, the potentials of the control gate, the drain and the source of each of the two memory cells M12 and M32 connected to bit line BL2 are 5V, 2V and 0V, respectively, as show in FIG. 11C. These two memory cells M12 and M32 therefore remain OFF irrespective of their storage data. No current flows from node D to node S through either of memory cells M12 and M32.

Out of the memory cells connected to word lines WL1 and WL3, all the drains of 6 memory cells M11, M13, M21, M23, M31 and M33 connected to bit lines BL1 and BL3 are in a floating state (see FIG. 11D and 11E). Therefore, no current is generated which flows from bit line BL1 to node S irrespective of the states of memory cells M11, M21 and M31 (either in an ON state or an OFF state). Similarly, no current is generated which flows from bit line BL3 to node S irrespective of the states of the memory cells M13, M23 and M33.

Whether the current is drawn out from node D or not is determined by whether a current flowing to bit line BL2 is generated or not, that is, by the storage data of the selected memory cell M22.

A sense amplifier (not shown) detects the presence of a current extracted from node D. The detection result of the sense amplifier is taken as the storage data of memory cell M22.

As described in the foregoing, a flash EEPROM including a memory cell structured by a single transistor requires low bit cost and advantageously achieve high integration. In operation, the flash EEPROM is structured to allow the total electrical erasing to be made for the storage data of all the memory cells.

As shown in FIG. 9, a memory cell array of a flash EEPROM is constituted by a plurality of blocks in general, not by a single block. FIG. 8 is a schematic block diagram showing a typical entire structure of a flash EEPROM With reference to FIG. 8, the flash EEPROM includes, for example, a memory array 100 divided into eight blocks 101–108, source/erase circuits 110, X decoder 120, Y decoders 130 and Y gates 140, each corresponding to each of 8 blocks 101–108. The flash EEPROM further includes sense amplifier and write circuits 150 provided corresponding to 8 blocks 101–108 and input/output buffers 160 provided corresponding to sense amplifier and write circuits 150. X decoder 120 is connected to terminals A0–Am for receiving external row address signals. Y decoder 130 is connected to terminals B0–Bn for receiving external column address signals. Input/output buffers 160 are respectively connected to terminals D0–D7 for receiving write data to memory array 100 and read data from the same. In memory array 100, word lines are provided each in common for 8 blocks 101–108, while bit lines BL are provided in the same number for each of 8 blocks 101–108. Each memory cell (not shown) is provided at a cross-over point of a word line WL and a bit line BL. In memory array 100, each of 8 blocks 101–108 corresponds to one bit.

X decoder 120, in response to external row address signals from address terminals A0–Am, selects one of the word lines WL and applies a high voltage (in a data writing) of about 12V or a power source voltage of 5V (in a data reading) to the selected word line WL. X decoder 120 also applies 0V to all the word lines WL in a data erasing. Y decoder 130, in response to external column address signals from address terminals B0–Bn, outputs a signal for selecting one of the bit lines BL in each block of memory array 100. More specifically, each Y gate 140 includes one MOS transistor 180 equivalent to transistors Q1–Q3 shown in FIG. 9, for each of all the bit lines BL included in the corresponding block (one of 101–108).

Y decoder 130 supplies a gate voltage to these MOS transistors 180 in response to the external column address signals to render one of the MOS transistors 180 which are included in the respective Y gates 140 conductive and the others non-conductive. MOS transistors 180 included in each Y gate 140 are provided between the respective bit line BL included in the corresponding block in memory array 100 and the corresponding sense amplifier and write circuit 150. As a result, one of the bit lines BL in each of 8 blocks 101–108 constituting memory array 100 is electrically connected to the corresponding sense amplifier and write circuit 150 through the corresponding Y gate 140. All bit lines BL in each of blocks 101–108 are connected to source/erase circuit 110 through the same source line 170. Source/erase circuit 110 applies 0V (in a data writing and a data reading) or a high voltage of about 10V (in a data erasing) to all the source lines 170.

In a data writing, 8-bit external data is applied to data input/output terminals D0–D7. Each of data input/output terminals D0–D7 receives a data signal of any one bit of the 8-bit data. Each input/output buffer 160 buffers the data signal from the corresponding data input/output terminal (one of D0–D7) and applies the same to the corresponding sense amplifier and write circuit 150. Each sense amplifier and write circuit 150 applies a high voltage of about 7V to the corresponding Y gate 140 when the data signal from the corresponding input/output buffer 160 corresponds to the logical value of "0" and applies a low voltage of about 0V to the corresponding Y gate 140 when the data signal from the corresponding input/output buffer 160 corresponds to the logical value of "1". As a result, the external data is written only in a single memory cell in each of 8 blocks 101–108 having a control gate and a drain connected to the word line WL supplied with a high voltage by X decoder 120 and the bit line BL supplied with a high voltage by Y gate 140.

In a data reading, each sense amplifier and write circuit 150 detects the presence of a current flowing through one bit line BL electrically connected to the circuit through the corresponding Y gate 140. Each sense amplifier and write circuit 150, when it detects the current flowing through said one bit line BL, outputs a data signal equivalent to the logical value "1" to the corresponding input/output buffer 160 and when no current flowing through said one bit line BL is detected, the circuit outputs a data signal equivalent to the logical value "0" to the corresponding input/output buffer 160. Each input/output buffer 160 buffers the data signal from the corresponding sense amplifier and write circuit 150 and outputs the same to the corresponding one of data input/output terminals D0–D7.

One-bit data is simultaneously written in each of 8 blocks 101–108 constituting memory array 100 in a single data writing and 1-bit data is simultaneously read from each of the 8 blocks 101–108 in a single data reading. That is, the data writing and the data reading are carried out on a byte basis.

In a data erasing, each sense amplifier and write circuit 150 applies a low voltage of about 0V to the corresponding Y gate 140. At the same time, Y decoder 130 renders conductive all the MOS transistors 180 included in the respective Y gates 140. As a result, the storage data of all the memory cells included in all the blocks 101–108 or storage data of one block included in memory array 100 is erased in a single data erasing.

In the data writing and the data erasing, the high voltage (equal to or larger than 5V) and a normal power source voltage (5V) to be applied to the word lines, the bit lines and the source line are externally supplied to power source terminals Vpp and Vcc, respectively. In practice, a switch circuit 190 selectively supplies either of the voltages applied to power source terminals Vpp and Vcc to source/erase circuit 110, X decoder 120 and Y decoder 130. Each function portion of the flash EEPROM operates as described above in response to such external control signals as a write enable signal WE for designating a data writing mode and an erase enable signal EE for designating a data erasing mode. The external control signals are supplied to a control terminal 192.

As described in the foregoing, the storage data of all the memory cells in each block in memory array 100 is erased in a single data erasing. That is, unlike the data writing and the data reading, the data erasing is not performed on a byte basis but simultaneously for all the bits or for each of the blocks constituting memory array 100.

While the flash EEPROM with one memory cell comprising one transistor requires low bit cost and achieves high integration density, in operation, data is erased on a block basis constituting a memory array, which makes selective erase of storage data of the memory array impossible.

Conventional non-volatile semiconductor memory devices, as described above, roughly fall into an EPROM and a flash EEPROM which require low bit cost and can be highly integrated, and an EEPROM which requires high bit cost and cannot be highly integrated with ease. With a recent increase in storage capacity of a semiconductor memory device, that is, an increase in the number of memory cells included in one semiconductor memory device, there is an increasing demand for a memory cell structure requiring low bit cost and achieving higher integration with ease. The non-volatile semiconductor memory devices which are previously described have the advantage in meeting such demands. In conventional EPROM and flash EEPROM, however, data erasing is performed for all the bits at the same time or on a block basis constituting a memory array. It is therefore impossible to selectively erase storage data of one or some memory cell(s) in the memory array and rewrite the memory cells. In this respect, the EPROM and the flash EEPROM are not highly functional. On the other hand, the latter non-volatile semiconductor memory devices (EEPROM) requiring high bit cost cannot achieve higher integration with ease, while the devices are highly functional because of the data erase made on a byte basis. As described in the foregoing, none of the conventional non-volatile semiconductor memory devices has a structure which allows an increase in storage capacity and is highly functional to selectively erase storage data of an arbitrary memory cell.

SUMMARY OF THE INVENTION

An object of the present invention is to provide a non-volatile semiconductor memory device in which storage data of a desired memory cell can be erased.

Another object of the present invention is to provide a non-volatile semiconductor memory device which allows erase of storage data of a desired memory cell only and can be highly integrated with ease with low bit cost.

A further object of the present invention is to provide a non-volatile semiconductor memory device having high functionality and a structure suitable for increasing storage capacity.

Still further object of the present invention is to provide a flash EEPROM also allowing erase of storage data of a desired memory cell only.

The non-volatile semiconductor memory device according to the present invention includes a plurality of memory cells arranged in a plurality of rows and columns, each of the plurality of memory cells including a field effect semiconductor device enabling erase of data by the tunnel phenomenon. Each field effect semiconductor device includes a control terminal, first and second conduction terminals and a floating gate region in which electric charges to be captured. In order to achieve the above-described objects, the non-volatile semiconductor memory device according to the present invention includes a first selection circuit for selecting one of a plurality of bit lines in response to an address signal in a data erasing mode of operation of the memory device, a second selection circuit for selecting one of a plurality of word lines in response to the address signal in a data erasing mode of operation of the memory device and a first voltage supplying circuit for supplying a voltage across a bit line selected by the first selection circuit and a word line selected by the second selection circuit in the data erasing mode. The voltage is set so as to cause the removal of a charge from the floating gate of a memory cell having between the first conduction terminal connected to the bit line selected by the first selection circuit and the floating gate region corresponding to the control terminal connected to the word line selected by the second selection circuit, by a tunnel phenomenon.

Preferably, the second conduction terminals of all the memory cells are connected together and a second voltage supplying circuit, in addition to the first voltage supplying circuit, is provided for supplying a voltage across the second conduction terminals connected together and all the word lines in the total erasing of the data. The voltage is set as high as causing the removal of a charge from each floating gate of all memory cell by a tunnel phenomenon between the second conduction terminal and the floating gate region in each memory cell.

In accordance with another aspect, the non-volatile semiconductor memory device according to the present invention having a selective erasing mode and a total erasing mode, includes a plurality of memory cells arranged in a plurality of rows and columns, a plurality of word lines provided corresponding to the plurality of rows, a plurality of bit lines provided corresponding to the plurality of columns, a first selection circuit, a second selection circuit and a total erasing circuit.

Each of the plurality of memory cells includes a field effect semiconductor device having a first conduction terminal connected to a corresponding bit line, a control terminal connected to a corresponding word line, a floating gate region for storing electric charges and a second conduction terminal, the second conduction terminals of the plurality of memory cells being connected together.

The first selection circuit is activated in the selective erasing mode to select one of the plurality of word lines and apply a predetermined low potential to the selected word line and is inactivated in the total erasing mode.

The second selection circuit is activated in the selective erasing mode to select one of the plurality of bit lines and apply a predetermined high potential to the selected bit line and is inactivated in the total erasing mode.

The total erasing circuit is activated in the total erasing mode to apply the predetermined high potential to the second conduction terminals connected together and is inactivated in the selective erasing mode.

As described above, the non-volatile semiconductor memory device according to the present invention includes a circuit for selecting one of the word lines and one of the bit lines in a data erasing and a circuit for applying a high voltage across the selected word line and the selected bit line to the tunnel phenomenon to be caused only in the memory cell arranged at the crossover point between the word line and the bit line. It is therefore possible to selectively erase only the storage data of some of the memory cells in a memory cell array but not the storage data of all the memory cells.

In order to achieve the above-described objects, the method of erasing data of the non-volatile semiconductor memory device according to the present invention is applicable to a non-volatile semiconductor memory device including memory cells arranged in a plurality of rows and columns, a plurality of word lines provided corresponding to the plurality of rows and a plurality of bit lines provided corresponding to the plurality of columns, each of the plurality of memory cells including a field effect semiconductor device having a first conduction terminal connected to a corresponding bit line, a control terminal connected to a corresponding word line, a floating gate region for storing electric charges and a second conduction terminal, and the method includes the steps of selecting one of the plurality of bit lines, selecting one of the plurality of word lines and applying a predetermined voltage as high as causing the floating gate region of a memory cell having the first conduction terminal and the control terminal respectively connected to the selected bit line and the selected word line to discharge the electric charges to the selected bit line.

The present invention therefore improves a non-volatile semiconductor memory device including memory cells each constituted by one transistor to allow only the storage data of a specific memory cell to be erased. As a result, such a non-volatile semiconductor memory device can be obtained as requiring low bit cost, suitable for high integration and having higher performance than the conventional memory devices.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A-2D are tables showing the potentials on a word line, a bit line and a source line of the non-volatile semiconductor device according to the embodiment in a data erasing.

FIG. 7 is a table showing the potentials at terminals V1-V3 and of control signals E, F, G, I and K shown in FIGS. 4 to 6 and FIGS. 15 to 17, in a data writing, a data erasing and a data reading.

FIGS. 10A-10D are tables showing the potentials on a word line, a bit line and a source line of the conventional flash EEPROM in a data writing.

FIG. 11A is a table showing the potentials on a word line, a bit line and a source line of the conventional flash EEPROM in a data erasing.

FIGS. 11B-11E are tables showing the potentials on a word line, a bit line and a source line of the conventional flash EEPROM in data reading.

FIG. 19 is a table showing logic levels of external control signals WE, BE and EE in a data writing, a selective erasing, a total erasing and a data reading in FIG. 18.

FIG. 20 is a table showing the potentials of the control gate, the drain and the source of a selected memory cell of a flash EEPROM in a data writing according to the embodiment of the present invention.

FIG. 21 is a table showing the potentials of the control gate, the drain and the source of a selected memory cell of a flash EEPROM in a data reading according to the embodiment of the present invention.

DESCRIPTION OF THE PREFERRED EMBODIMENTS

Figure 1:
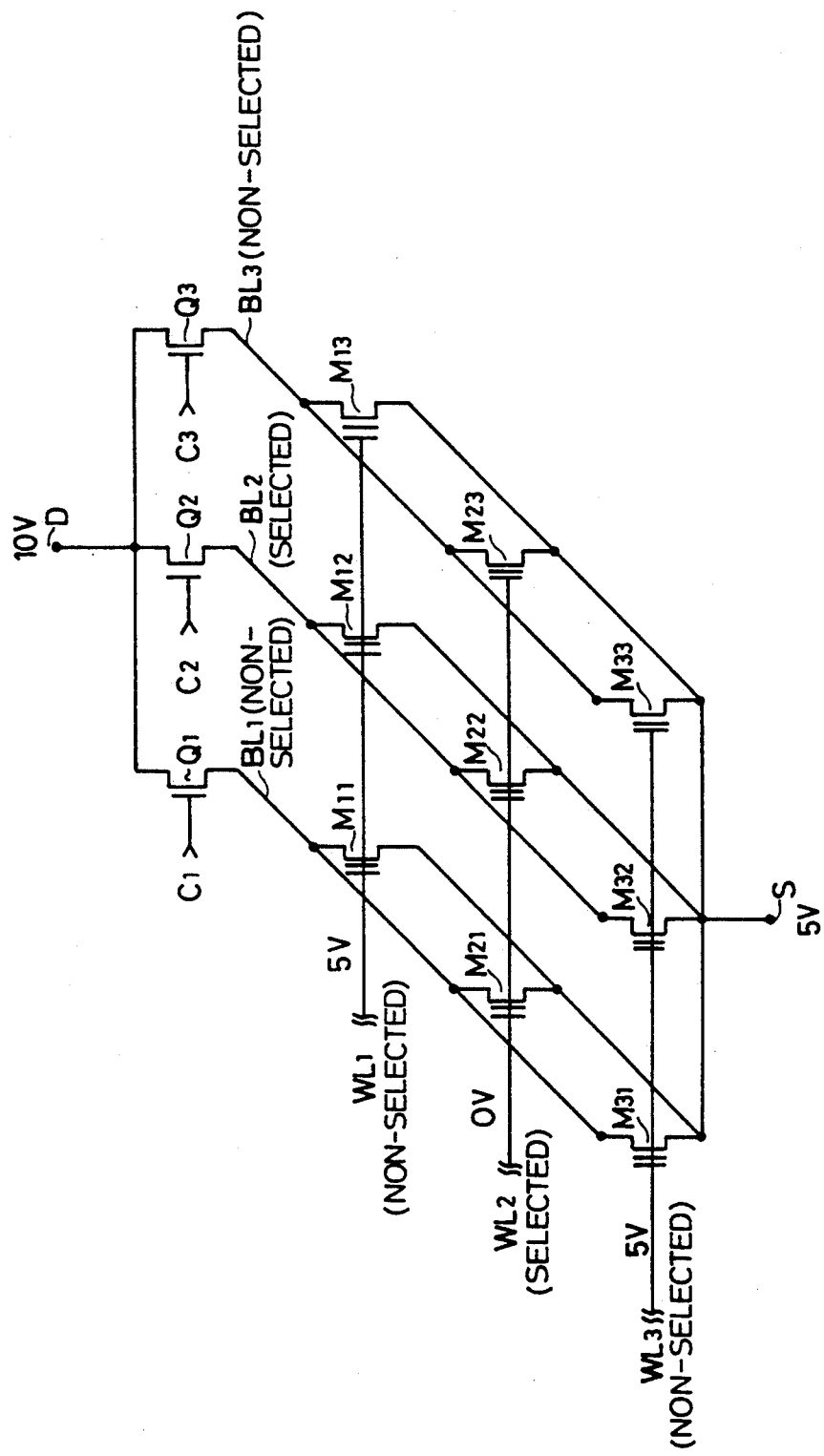
FIG. 1 is a conceptual circuit diagram showing an arrangement of a memory array in a non-volatile semiconductor memory device according to one embodiment of the present invention.
Figure 14:
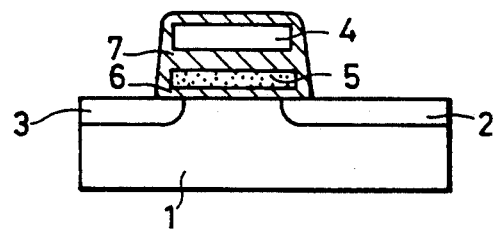
FIG. 14 is a diagram showing the sectional structure of each memory cell in a conventional flash EEPROM.

FIG. 1 is a conceptual circuit diagram showing the arrangement of the memory array of a non-volatile semiconductor memory device according to one embodiment of the present invention. In this case, memory cells are arranged in a matrix of 3 rows and 3 columns in the memory array. The structure of each memory cell in the semiconductor memory device according to the present embodiment is the same as that of a conventional flash EEPROM (FIG. 14).

Figure 9:
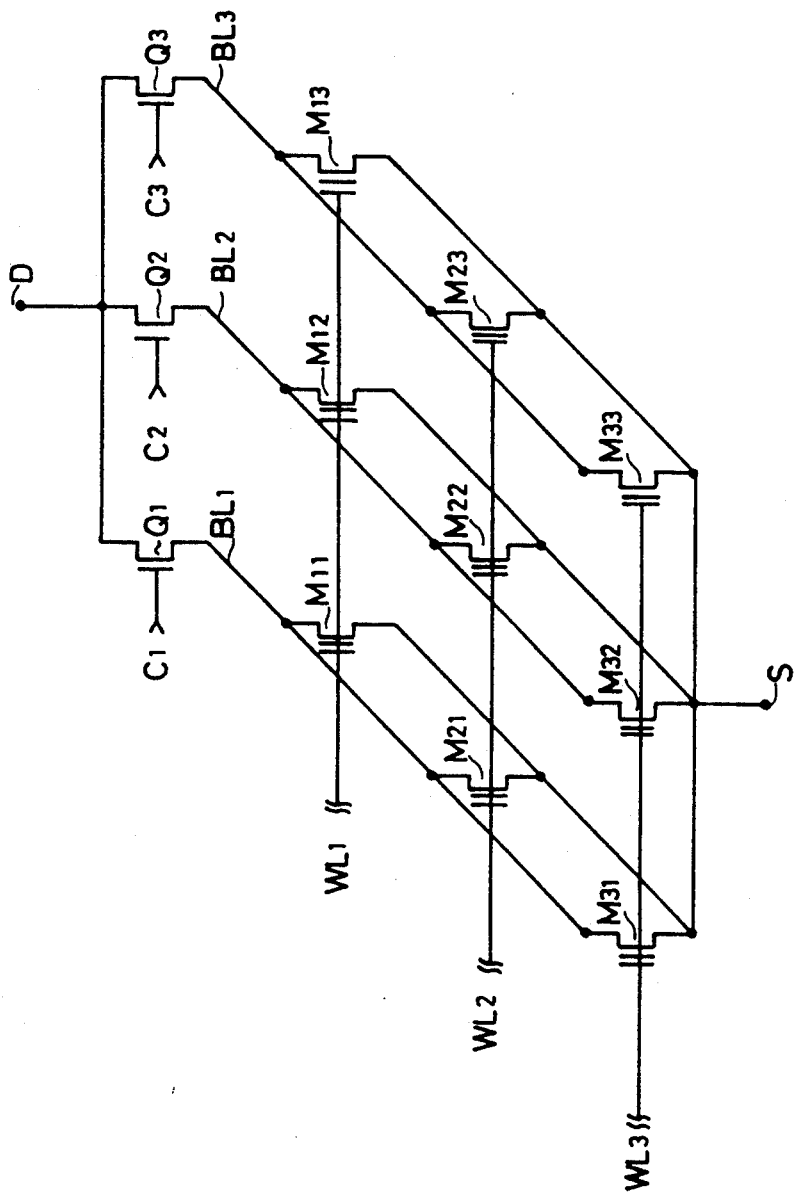
FIG. 9 is a conceptual circuit diagram showing the arrangement of a memory array in a conventional flash EEPROM.
Figure 12:
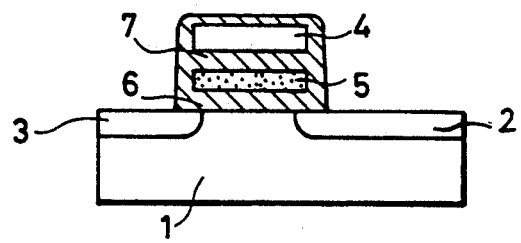
FIG. 12 is a diagram showing the sectional structure of each memory cell in an EPROM.
Figure 13:
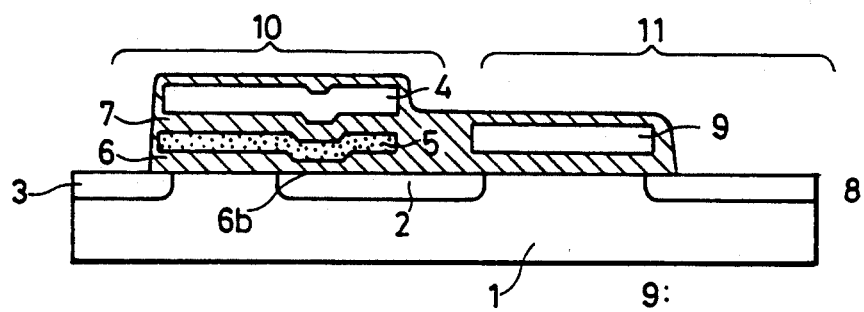
FIG. 13 is a diagram showing the sectional structure of each memory cell in an EEPROM.

With reference to FIG. 1, 9 memory cells Mij (i=1, 2, 3;j=1, 2, 3) are connected to 3 word lines WL1-WL3 and 3 bit lines BL1-BL3 as in a conventional flash EEPROM (FIG. 9). The respective sources of 9 memory cells Mij are connected to the same node S. Bit lines BL1, BL2 and BL3 are connected to the same node D through N channel MOS transistors Q1, Q2 and Q3, respectively. Transistors Q1, Q2 and Q3 are respectively controlled by control signals C1, C2 and C3 to become conductive. Description of a data writing and a data reading, carried out in the same manner as in the conventional flash EEPROM, will be omitted.

In a data erasing, a high potential and a ground potential can be respectively applied to only the bit line and the word line connected to a memory cell whose data is to be erased unlike a conventional flash EEPROM. It is therefore possible to selectively erase the storage data of a specific memory cell and to totally erase the storage data of all the memory cells.

Description will be given of the potentials to be applied to the nodes and the signal lines shown in FIG. 1 in a selective erasing with reference to FIGS. 2A-2D. FIGS. 2A-2D are tables showing the potentials of respective control gates, drains and sources of a memory cell which storage data is to be erased and of memory cells which storage data is not to be erased in a selective erasing.

In a selective erasing, a high voltage of about 10V is applied to node D to apply a ground potential to node S or render node S floating. At the same time, one of control signals C1–C3 is selectively brought to a logical high level and one of word lines WL1–WL3 is selectively supplied with the ground potential. For erasing the storage data of a memory cell M22, for example, the logical level of control signal C2 is brought to high and those of the other control signals C1 and C3 are brought down to low. Then, the ground potential is applied to word line WL2 and a positive potential of about 5V is applied to the other word lines WL1 and WL3.

A high voltage of about 10V is applied to induce a high electric field required for causing a tunnel phenomenon in a selected memory cell. A positive potential of about 5V is applied to prevent a high electric field from being induced in a non-selected memory cell.

Figure 3:
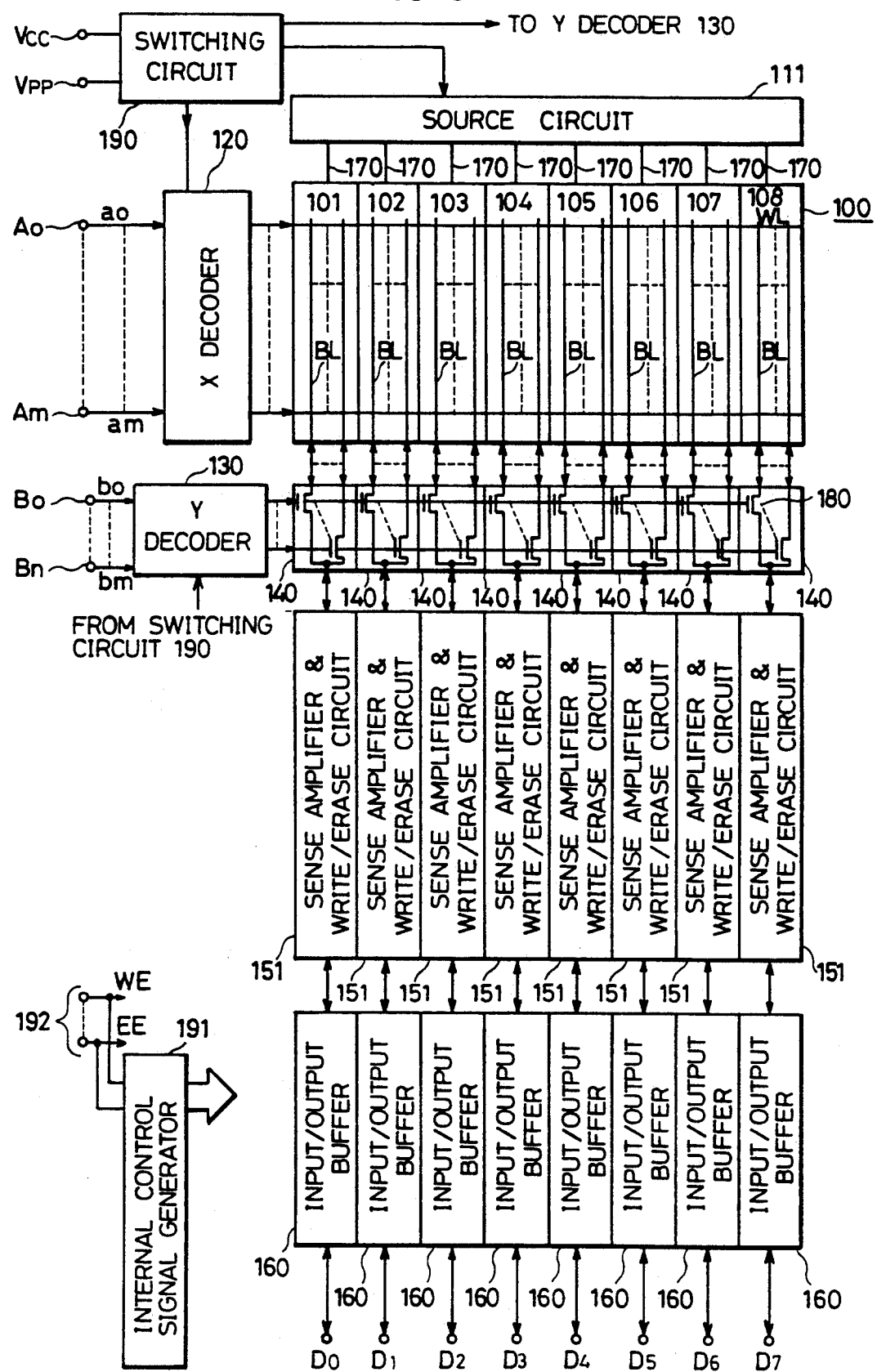
FIG. 3 is a schematic block diagram showing the entire structure of the non-volatile semiconductor memory device according to the embodiment.
Figure 15:
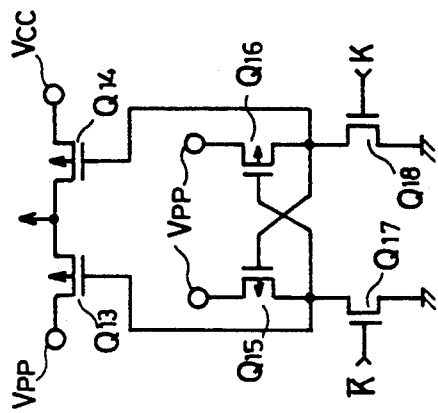
FIG. 15 is a circuit diagram showing an example of a structure of power source switching circuit SW1 of FIG. 6.
Figure 16:
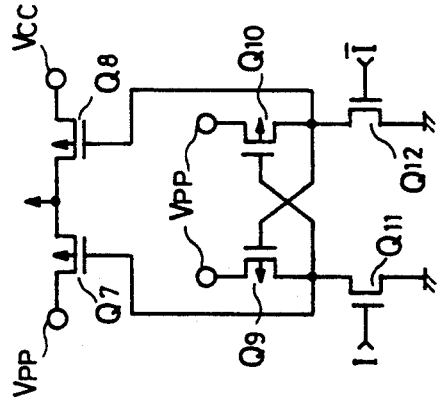
FIG. 16 is a circuit diagram showing an example of a structure of power source switching circuit SW2 of FIG. 4.
Figure 17:
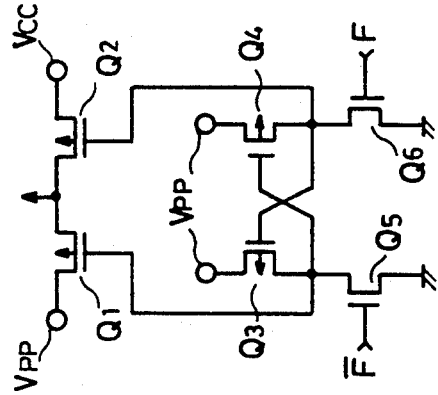
FIG. 17 is a circuit diagram showing an example of a structure of power source switching circuit SW3 of FIG. 5.

V1, V2 and V3 are connected to power source switching circuits SW1, SW2 and SW3 coupled to power source terminals Vcc and Vpp of FIG. 3, respectively. FIGS. 15, 16 and 17 are circuit diagrams showing examples of the structures of power source switching circuits SW1, SW2 and SW3, respectively.

With reference to FIG. 15, power source switching circuit SW1 is controlled by a control signal F and an inversion signal thereof. When control signal F is at a high level, transistor Q6 is turned on, transistor Q5 is turned off and transistor Q3 is turned on due to a potential decrease at the node between transistors Q4 and Q6. As a result, the node between transistors Q3 and Q5 attains a high potential to turn off transistor Q1. With a low potential being applied to the gate from the node between transistors Q4 and Q6, transistor Q2 is turned on. An ordinary power source voltage 5V from power source terminal Vcc appears at the node between transistors Q1 and Q2 as a result.

Conversely, when control signal F is at a low level, transistor Q6 is turned off, while transistor Q5 is turned on. The potential at the node between transistors Q3 and Q5 is lowered to turn on transistor Q1, while the potential at the node between transistors Q4 and Q6 is increased to turn off transistor Q2. As a result, a high voltage from power source terminal Vpp appears at the node between transistors Q1 and Q2. The potential at the node between transistors Q1 and Q2 is supplied to terminal V1 of FIG. 6.

With reference to FIG. 16, power source switching circuit SW2 is controlled by control signal I and an inversion signal of the same. When control signal I is at a high level, transistor Q11 is turned on, while transistor Q12 is turned off. The potential at the node between transistors Q9 and Q11 is lowered, while the potential at the node between transistors Q10 and Q12 is increased. As a result, transistor Q7 is turned on and transistor Q8 is turned off, whereby a high voltage of power source terminal Vpp appears at the node between transistors Q7 and Q8.

Conversely, when control signal I is at a low level, transistor Q11 is turned off and transistor Q12 is turned on. In this case, therefore, transistor Q8 is turned on due to a potential decrease at the node between transistors Q10 and Q12, while transistor Q7 is turned off due to a potential rise at the node between transistors Q9 and Q11, thereby applying an ordinary power source voltage from power source terminal Vcc to the node between transistors Q7 and Q8. The potential at the node between transistors Q7 and Q8 is supplied to a terminal V2 of FIG. 4.

With reference to FIG. 17, power source switching circuit SW3 is controlled by a control signal K and an inversion signal of the same. When control signal K is at a high level, transistor Q18 is turned on and transistor Q17 is turned off. Transistor Q14 is turned on due to a potential decrease at the node between transistors Q16 and Q18, while transistor Q13 is turned off due to a potential rise at the node between transistors Q15 and Q17. As a result, an ordinary power source voltage from power source terminal Vcc is applied to the node between transistors Q13 and Q14.

Conversely, when control signal K is at a low level, transistor Q17 is turned on and transistor Q18 is turned off. In this case, therefore, the potential decrease at the node between transistors Q15 and Q17 turns on transistor Q13, while the potential rise at the node between transistors Q16 and Q18 turns off transistor Q14. A high voltage from power source terminal Vpp is applied to the node between transistors Q13 and Q14. The potential at the node between transistors Q13 and Q14 is supplied to terminal V3 of FIG. 5.

The potentials of the control gate, the drain and the source of memory cell M22 selected as a memory cell which storage data is to be erased therefore become 0V, 10V and 5V (or enter a floating state) as shown in FIG. 2A. As a result, a high electric field with the drain as a higher potential side, is generated between the floating gate and the drain of memory cell M22, thereby causing the tunnel phenomenon between the floating gate and the drain. That is, the electrons stored in the floating gate of the selected memory cell M22 are discharged to the drain.

The potentials of the respective control gates, drains and sources of memory cells M21 and M23 connected to the same word line WL2 as memory cell M22 is connected to, out of the non-selected memory cells which are not selected as a memory cell which storage data is to be erased, become 0V, 0V and 5V (or enter a floating state), respectively, as shown in FIG. 2B. In each of memory cells M21 and M23, although the control gate is grounded, no voltage as high as causing the tunnel phenomenon is applied to either the source or the drain. No electron is discharged from the floating gate of each non-selected memory cell (M21, M23) as a result.

The control gate, the drain and the source potentials of memory cells M11 and M32 connected to the same bit line BL2 as memory cell M22 is connected to, out of the non-selected memory cells, become 5V, 10V and 5V (or enter a floating state), respectively, as shown in FIG. 2C. As a result, while a high voltage is applied to the drain a positive voltage is applied to each control gate, so that no electric field as high as causing the tunnel phenomenon between the control gate and the drain is applied, in each of memory cells M12 and M32. No electron is discharged from the floating gate of each non-selected memory cell (M12, M32).

As shown in FIG. 2D, the control gate, the drain and the source potentials of each of the other non-selected memory cells M11, M13, M31 and M33 become 5V, 0V and 5V (or enter a floating state). As a result, an electric field with the floating gate as a higher potential side, is applied between the floating gate and the drain so that no electron is discharged from the floating gate, in each of memory cells M11, M13, M31 and M33. Consequently, only the storage data of the selected memory cell M22 is erased.

The drain of the non-selected memory cell can be at a floating state as long as the read voltage is equal to or below 5V (ordinarily about 0V).

As described above, data erasing in the non-volatile semiconductor memory device according to the present embodiment is carried out by selectively applying a potential for causing the tunnel phenomenon to a bit line and a word line connected to a memory cell which storage data is to be erased. It is therefore possible to erase only the storage data of a desired memory cell.

Figure 8:
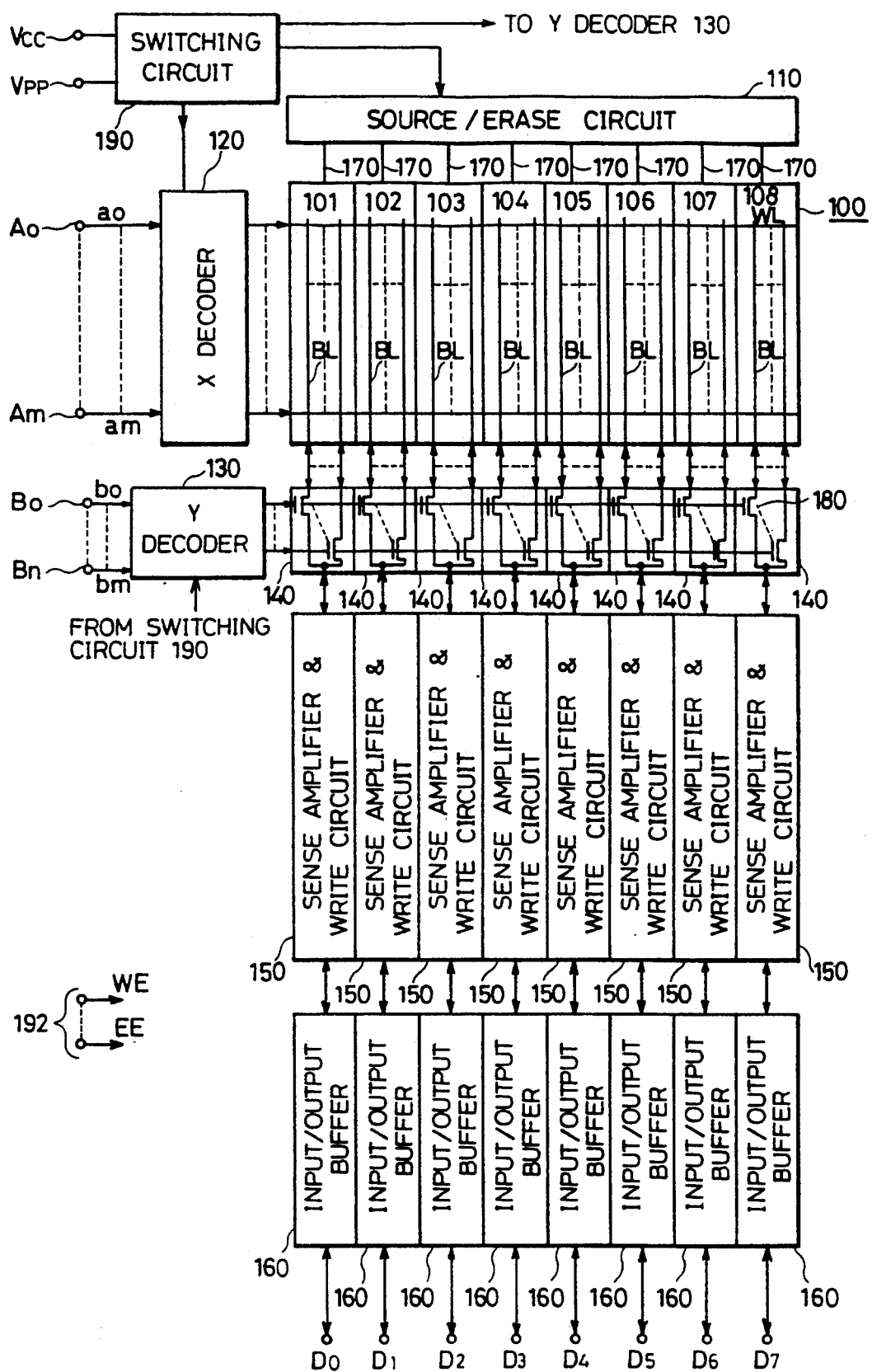
FIG. 8 is a schematic block diagram showing the entire structure of a conventional flash EEPROM.

FIG. 3 is a schematic block diagram showing the entire structure of the non-volatile semiconductor memory device according to the present embodiment. With reference to FIG. 3, the non-volatile semiconductor memory device according to the present embodiment has the entire structure basically the same as that of the conventional flash EEPROM shown in FIG. 8, with a difference being that X decoder 120 selects one of the word lines WL at the time of data erasing and applies the ground potential to the selected word line WL and applies 5V to the other word lines WL. Y decoder 130 is structured to render one of the MOS transistors 180 included in the respective Y gates 140 conductive and the others non-conductive not only in a data writing/reading but also in a data erasing. Differently from that shown in FIG. 8, source circuit 111 is structured to apply 5V to all the source lines 170 in a data erasing. Each sense amplifier and write/erase circuit 151 is structured to output 10V to a corresponding Y gate 140 in a data erasing.

Figure 4:
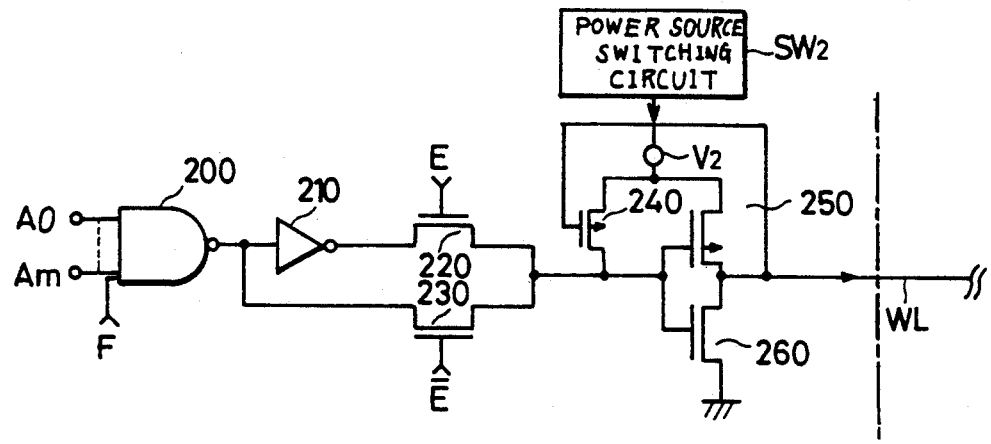
FIG. 4 is a circuit diagram showing a part of the structure of X decoder 120 of FIG. 3.

FIG. 4 is a partial circuit diagram showing the structure of X decoder 120 of the present embodiment. With reference to FIG. 4, X decoder 120 includes a (m+2)input NAND gate 200, an inverter 210, N channel MOS transistors 220, 230 and 260 and P channel MOS transistors 240 and 250 corresponding to each of all the word lines WL. NAND gate 200 receives signals a0–am respectively from row address terminals A0–Am with their logical levels unchanged or inverted. NAND gate 200 further receives a control signal F. More specifically, NAND gate 200 receives signals a0–am inverted or non-inverted such that all the signals except control signal I input to NAND gate 200 attain a logical high level when row address terminals A0–Am receive row address signals designating the addresses of the corresponding word line WL. Inverter 210 inverts the output of NAND gate 200. Transistor 220 is provided between the output end of inverter 210 and the gates of transistors 250 and 260, and transistor 230 is provided between the output end of NAND gate 200 and the gates of transistors 250 and 260. Transistors 250 and 260 are connected in series between a terminal V2 and ground. Transistor 240 is provided between terminal V2 and the gates of transistors 250 and 260. The node between transistors 250 and 260 is connected to the corresponding word line WL and the gate of transistor 240.

Transistors 220 and 230 are controlled to be conductive or non-conductive by a control signal E and the inversion signal thereof.

Figure 5:
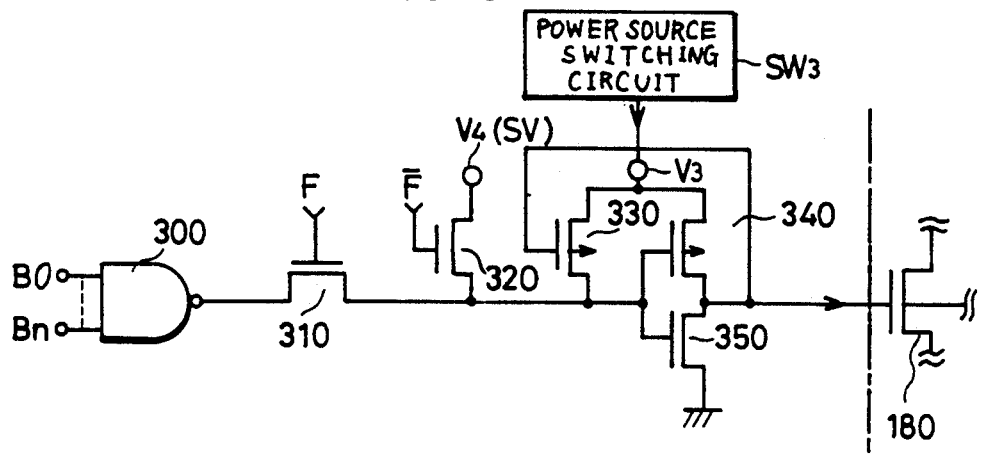
FIG. 5 is a circuit diagram showing a part of the structure of Y decoder 130 of FIG. 3.

FIG. 5 is a partial circuit diagram showing the structure of Y decoder 130 according to the present embodiment. With reference to FIG. 5, Y decoder 130 includes a (n+1)input NAND gate 300, N channel MOS transistors 310, 320 and 350 and P channel MOS transistors 330 and 340 all of which are provided corresponding to each transistor 180 included in one Y gate 140. NAND gate 300 receives (n+1) input signals, constituting column address signals from the column address terminals B0–Bn, with non-inverted or inverted such that all the (n+1) input signals attain a logical high level when a column address signal designating the address of the bit line BL connected to the corresponding transistor 180 is applied to NAND gate 300. The output of NAND gate 300 is applied to the gates of transistors 340 and 350. Transistors 340 and 350 are connected in series between terminal V3 and ground. The node between transistors 340 and 350 is connected to the gate of a transistor 180 corresponding to each Y gate 140 and to the gate of transistor 330. Transistor 330 is provided between terminal V3 and the gates of transistors 340 and 350. Transistor 320 is provided between a terminal V4 being constantly supplied with 5V and the gates of transistors 340 and 350. Transistors 310 and 320 are controlled to be conductive or non-conductive by a control signal F and the inversion signal thereof.

Figure 6:
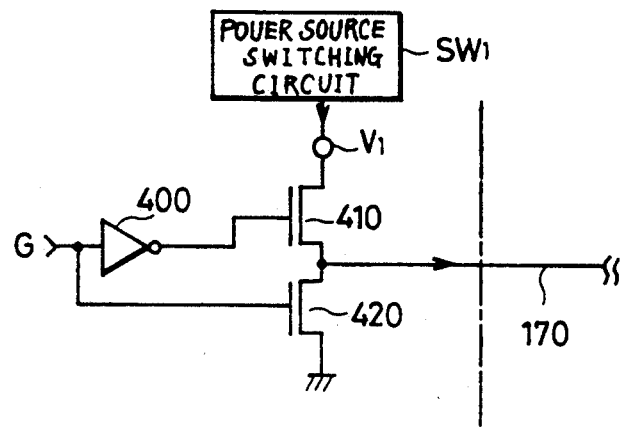
FIG. 6 is a circuit diagram showing the structure of source circuit 110 of FIG. 3.

FIG. 6 is a circuit diagram showing the structure of source circuit 110 according to the present embodiment. With reference to FIG. 6, source circuit 111 includes an inverter 400 for receiving a control signal G and N channel MOS transistors 410 and 420 corresponding to each source line 170 or all the source lines 170. Transistors 410 and 420 are connected in series between a terminal V1 and ground. The gates of transistors 410 and 420 receive the output of inverter 400 and control signal G.

A high voltage and 5V are externally applied to external terminals Vpp and Vcc, respectively, also in the present embodiment. In practice, switch circuit 190 selectively applies 5V and 12V respectively applied from terminals Vcc and Vpp to terminals V1–V3 of FIGS. 4 to 6. Terminal V4 is connected to terminal Vcc in FIG. 6. Control signals E, F, G, I and K are internally generated based on external control signals (for example, a write enable signal WE, an erase enable signal EE and the like) directly or indirectly designating one mode among a data writing, a data reading, a total data erasing and a data erasing on a byte basis. That is, in response to such external control signals, internal control signal generation circuit 191 generates signals E, F, G, I and K having such logical levels as shown in FIG. 7 in accordance with the mode designated by the external control signals in FIG. 3.

Switching circuit 190 includes power source switching circuit SW1–SW3.

In a data writing, control signals F, I and K are set to a high level, a high level and a low level, respectively (see FIG. 7(a)), so that an ordinary power source voltage 5V is supplied to terminal V1 from power source switching circuit SW1, a high voltage of 12V is applied to terminal V2 from power source switching circuit SW2 and a high voltage of 12V is applied to terminal V3 from power source switching circuit SW3.

In a selective erasing, with control signals F, I and K being at a high level, a low level and a low level, respectively (see FIG. 7(b)), the output voltages of power source switching circuits SW1, SW2 and SW3 become an ordinary power source voltage 5V, an ordinary power source voltage 5V and a high voltage 12V, respectively.

In a total erasing, with control signals F, I and K being at a low level, a low level and a high level (see FIG. 7(c)), output voltages of power source switching circuits SW1, SW2 and SW3 become a high voltage of 12V, an ordinary power source voltage of 5V and an ordinary power source voltage of 5V, respectively.

In a data reading, with control signals F, I and K attaining a high level, a low level and a high level, respectively (see FIG. 7(d)), the output voltages of power source switching circuits SW1, SW2 and SW3 become an ordinary power source voltage of 5V.

Figure 18:
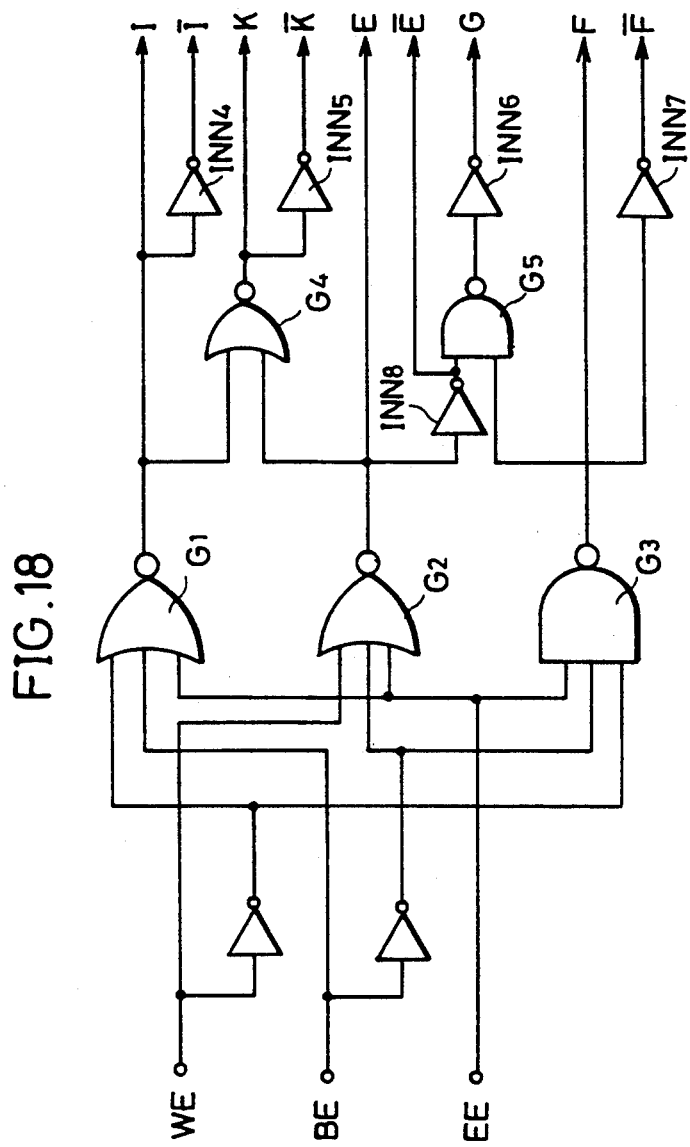
FIG. 18 is a circuit diagram showing an example of a structure of internal control signal generation circuit 191 of FIG. 3.

FIG. 7 is a table showing the potentials applied to terminals V1-V3 and the logical levels of control signals E, F, G, I and K in each of a data writing, a data erasing and a data reading. FIG. 18 is a circuit diagram showing an example of the structure of internal control signal generation circuit 191 of FIG. 3. With reference to FIG. 18, internal control signal generation circuit 191 is structured to be operable in response to a write enable signal WE, an erase enable signal EE and a selective erase enable signal BE, for example. Selective erase enable signal BE is externally supplied as a control signal for instructing a circuit operation for such a selective erase as described above at a high level. Erase enable signal EE is externally supplied as a control signal instructing a circuit operation for such a total erase as described above at a high level.

FIG. 19 is a table showing logic levels of a write enable signal WE, a selective erase enable signal BE and an erase enable signal EE in each mode.

With reference to FIGS. 18 and 19, the structure and the operation of internal control signal generation circuit 191 will be described in the following.

In a data writing as shown in FIG. 19(a), write enable signal WE, selective erase enable signal BE and erase enable signal EE attain a high level, a low level and a low level, respectively. The output signals of a NOR gate GE, a NOR gate G2 and a NAND gate G3 respectively attain a high level, a low level and a high level in FIG. 18. As a result, one of the input signals to a NOR gate G4 attains a high level and all the input signals to a NAND gate G5 attain a high level, whereby both of the output signals of NOR gate G4 and NAND gate G5 attain a low level. As a result, both of inverters INV5 and INV6 output a high level signal. The output signals of both of inverters INV4 and INV7 are at a low level.

It is therefore possible to use the output signals of NOR gate G1 and inverter INV4 as a control signal I and an inversion signal of the same, respectively, the output signals of NOR gate G4 and inverter INV5 as a control signal K and an inversion signal of the same, respectively, the output signals of NOR gate G2 and INV8 as a control signal E and an inversion signal of the same, respectively, the output signal of inverter INV6 as a control signal G and the output signals of NAND gate G3 and inverter INV7 as a control signal F and an inversion signal of the same, respectively.

In a selective erase, out of the three control signals WE, BE and EE, only the selective erase enable signal BE attains a high level and the others are brought to a low level as shown in FIG. 19(b). Unlike a data writing, the output signals of NOR gates G1 and G2 attain a low level and a high level, respectively. As a result, control signals E, G and I have logic levels opposite to those in a data writing.

In a total erase, erase enable signal EE is brought to a high level and the other control signals WE and BE are both brought to a low level as shown in FIG. 19(c). Unlike a selective erasing, all of the output signals of NOR gates G1 and G2 and NAND gate G3 attain a low level. As a result, all of control signals I, E, G and F attain a low level, while only the control signal K attains a high level.

In a data reading, all of write enable signal WE, selective erase enable signal BE and erase enable signal EE are brought to a low level as shown in FIG. 19(d). The output signals of both of NOR gates G1 and G2 attain a low level, while the output signal of NAND gate G3 attains a high level. As a result, both of control signals I and E attain a low level and control signals K, G and F all attain a high level.

With reference to FIGS. 3 to 7, the operation of X decoder, Y decoder and source circuit will be described in each of the data writing, the data erasing and the data reading according to the present embodiment.

In a data writing, the potentials of terminals V1-V3 and the logical levels of control signals E, F and G are set as shown in FIG. 7(a). Therefore, the output logical level of NAND gate 200 is determined by other input signals than control signal F, that is, by row address signals. At the same time, transistor 230 conducts to supply a high voltage 12V to the corresponding word line WL through transistor 250 when the output logical level of NAND gate 200 is low. NAND gate 200 attains a low output logical level only when all the input signals other than control signal F, attain a logical high level, that is, only when the row address signal designates the address of the corresponding word line WL. Therefore, only the output logical level of NAND gate 200 provided corresponding to one word line WL designated by the input row address signals attains a low level, while all the other NAND gates 200 attain a high output logical level. As a result, the high voltage 12V is applied only to the one word line WL corresponding to the row address signal, while the ground potential 0V is applied to the other word lines WL by the corresponding transistors 260. In FIG. 5, with transistor 310 becoming conductive and transistor 320 becoming nonconductive, when the output of NAND gate 300 attains a logical low level, transistor 340 supplies 5V to the gate of the corresponding transistor 180 in each Y gate 140. The output of NAND gate 300 attains a logical low level only when all the input signals to the NAND gate 300 attain a logical high level, that is, when a column address signal designates the address of the bit line BL connected to transistor 180 provided corresponding to the NAND gate 300. As a result, only one bit line BL designated by the column address signal in each Y gate 140 is electrically connected to the corresponding sense amplifier and write/erase circuit 150, while the other bit lines BL enter a floating state. In FIG. 6, with transistor 420 conducting, the ground potential 0V is applied to source line 170.

In a data writing, therefore, the control gate, the drain and the source of the selected memory cell are supplied with a high voltage of 12V, a high voltage of 7 and a ground potential 0V from X decoder 120, sense amplifier and write/erase circuit 151 and source circuit 111 in the same manner as in the prior art (see FIG. 20). As a result, external data "0" is written in one memory cell arranged at a cross-over point between one word line WL designated by row address signals and one bit line BL designated by column address signals in each of 8 blocks 101-108 of FIG. 3.

In a selective erasing, the logical levels of terminals V1-V3 and control signals E, F and G are set as shown in FIG. 7(b). In FIG. 4, NAND gate 200 outputs a low level signal only when row address signal designates the corresponding word line WL, whereby transistor 220 conducts. As a result, the word line WL is supplied with the ground potential 0V by the corresponding transistor 260 only when the row address signals designating the address of the word line WL is externally supplied and is supplied with potential 5V of terminal V2 by the corresponding transistor 250 in other cases. That is, only one word line WL designated by row address signals attains 0V potential, while all of the other word lines WL attain a potential of 5V. With Y decoder 130 operating in the same manner as in a data writing, only one bit line BL designated by column address signals is electrically connected to the corresponding sense amplifier and write/erase circuit 151, in each of 8 blocks 101-108. Each sense amplifier and write/erase circuit 150 outputs a high voltage of 10V in a data erasing. As a result, a high voltage of 10V is applied to one bit line BL in each of the blocks 101-108, while all of the other bit lines BL enter a floating state. In FIG. 6, with transistor 410 conducting, the potential of all the source lines 170 become a potential of 5V.

Tunnel phenomenon therefore occurs only in one memory cell arranged at a cross-over point of a word line WL designated by row address signal and a bit line BL designated by column address signals, resulting in erase of the storage data of the one memory cell in each of 8 blocks 101-108 constituting memory array 100 of FIG. 3.

In a data reading, the logical levels of control signals E, F and G are similarly set to those in a data writing and all the potentials of terminals V1-V3 are set to 5V (see FIG. 7(d)). In FIG. 4, therefore, 5V is applied to a word line WL in response to row address signals designating the word line WL. In FIG. 5, a bit line BL is electrically connected to the corresponding sense amplifier and write/erase circuit 151 in response to column address signals designating the bit line BL. As a result, the bit line BL is supplied with a read voltage 5V in response to the column address signals designating the bit line BL. Source circuit 111 operates in the same manner as in a data writing to ground all the source lines 170.

As a result, data is read only from one memory cell arranged at a cross-over point between one word line WL designated by the row address signals and one bit line BL designated by a column address signals in each of 8 blocks 101-108 constituting memory array 100 of FIG. 3.

As described in the foregoing, in the non-volatile semiconductor memory device according to the present embodiment, memory cells are selected one from each of 8 blocks 101-108 constituting memory array 100, for which memory cells a total data writing, a total data reading and a total data erasing are performed. That is, unlike a conventional flash EEPROM, not only data writing and reading but also a data erasing can be done on a byte basis.

The non-volatile semiconductor memory device according to the present embodiment also enables a total erasing of the storage data of all the memory cells in memory cell array 100. Specifically, the potentials of terminals V1-V3 and the logical levels of control signals E, F and G are set as shown in FIG. 7(c) for such a total erasing.

In a total erasing, NAND gate 200 outputs a high level signal and transistor 230 conducts irrespective of the logical levels of all the input signals other than control signal F, whereby transistor 260 applies a ground potential 0V to a word line WL. As a result, the potential on each word line WL in memory array 100 is brought to 0V by the corresponding transistor 260. In FIG. 5, with transistor 310 becoming non-conductive and transistor 320 becoming conductive, the gate of transistor 180 is supplied with the ground potential by transistor 350. The bit line BL is electrically disconnected from the corresponding sense amplifier and write/erase circuit 150 to enter a floating state. As a result, all the bit lines BL in memory array 100 enter a floating state. In FIG. 6, source line 170 is supplied with a high voltage 12V through transistor 410. As a result, the potential of all the source lines 170 becomes a high potential of 12V.

In FIG. 3, therefore, a tunnel phenomenon occurs in all the memory cells in each of 8 blocks 101-108 constituting memory cell 100, resulting in a simultaneous erasing of the storage data of all the memory cells in memory array 100.

As described above, the present embodiment enables both a data erasing on a byte basis and a simultaneous data erasing for all the bits, with each memory comprising one transistor. It is therefore possible to obtain a non-volatile semiconductor memory device highly functional in data erasing which requires a low bit cost and achieves high integration with ease.

Although the above-described embodiments have been described taking, as an example, a case (byte arrangement) where a memory array is divided into 8 blocks each corresponding to one bit, the memory array can be divided into any number. The present invention is applicable to a non-volatile semiconductor memory device having a memory array to output 16-bit or 32-bit data, for example.

The non-volatile semiconductor memory device according to the present invention is structured such that electrons are drawn out from a floating gate to a drain of a selected memory cell in each block in a selective data erasing. However, similar to a total erasing, electrons can be drawn out from a floating gate to a source of a selected memory cell in each block in a selective data erasing. It is necessary in this case to provide one source line corresponding to each memory cell column so as to individually apply a source potential to each memory cell column in each block constituting the memory array. The application of the present invention to a conventional flash EEPROM therefore requires a drastic improvement. In this respect, the non-volatile semiconductor memory device according to the present embodiment is more preferable because it can be obtained by slightly improving a conventional flash EEPROM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
   memory cells arranged in a plurality of rows and columns,
   a plurality of word lines provided corresponding to said plurality of rows,
   a plurality of bit lines provided corresponding to said plurality of columns,
   each of said plurality of memory cells including a field effect semiconductor device having a first conduction terminal connected to a corresponding one of said bit lines, a control terminal connected to a corresponding one of said word lines, a floating gate region for storing electric charges and a second conduction terminal, first selecting means for selecting one of said plurality of bit lines in response to an address signal in a selective erasing mode of operation of said memory device, and second selecting means for selecting one of said plurality of word lines in response to said address signal in said selective erasing mode of operation of said memory device, and first voltage supplying means for supplying a voltage across said one bit line selected by said first selecting means and said one word line selected by said second selecting means whereby a charge stored on the floating gate of a corresponding floating gate region is removed therefrom by a tunnel phenomenon caused between the corresponding first conduction terminal and the corresponding floating gate region.

2. The non-volatile semiconductor memory device according to claim 1, wherein said second conduction terminals of said plurality of memory cells being connected together, the device further comprising second voltage supplying means for supplying a voltage in a total erasing mode of operation of said memory device across said second conduction terminals connected together and said plurality of word lines whereby a charge stored on the floating gate of a corresponding floating gate region is removed therefrom by a tunnel phenomenon caused between said second conduction terminals connected together and the corresponding floating gate regions.

3. The non-volatile semiconductor memory device according to claim 2, further comprising control means disabling said first and second selecting means in said total erasing mode and disabling said second voltage supplying means in said selective erasing mode.

4. The non-volatile semiconductor memory device according to claim 3, wherein said first voltage supplying means includes means for supplying a predetermined high voltage to said selected bit line and means for supplying a predetermined low potential to said selected word line, and said second high voltage supplying means includes means for supplying said predetermined high voltage to said second conduction terminals connected together, means for supplying said predetermined low potential to each of said plurality of word lines and means for causing each of said plurality of bit lines to enter a floating state.

5. A non-volatile semiconductor memory device having a selective erasing mode and a total erasing mode, comprising;

a plurality of memory cells arranged in a plurality of rows and columns, a plurality of word lines provided corresponding to said plurality of rows, a plurality of bit lines provided corresponding to said plurality of columns, each of said plurality of memory cells including a field effect semiconductor device having a first conduction terminal connected to a corresponding bit line, a control terminal connected to a corresponding word line, a floating gate region for storing electrical charges and a second conduction terminal, said second conduction terminals of said plurality of said plurality of memory cells in rows and columns being connected together, first selecting means being activated in said selective erasing mode to select one of said plurality of bit lines to apply a predetermined high potential to the first conduction terminal of said plurality of memory cells connected to the selected bit line and said first selecting means being inactivated in said total erasing mode, second selecting means being activated in said selective erasing mode to select one of said plurality of word lines to apply a predetermined low potential to the control terminals of said plurality of memory cells connected to the selective word line and said second selecting means being inactivated in said total erasing mode, and total erasing means being inactivated in said total erasing mode to apply said predetermined high potential to said second conduction terminals connected together and said erasing means being inactivated in said selective erasing mode.

6. A non-volatile semiconductor memory device comprising:

memory cells arranged in a plurality of rows and columns, a plurality of word lines provided corresponding to said plurality of rows, a plurality of bit lines provided corresponding to said plurality of columns, each of said plurality of memory cells including a field effect semiconductor device having a first conduction terminal connected to a corresponding one of said bit lines, a control terminal connected to a corresponding one of said word lines, a floating gate region for storing electric charges and a second conduction terminal, first, second and third voltages respectively applied to said first and second conduction terminals and said control terminal predetermined to store a charge on said floating gate region respective application of a fourth voltage, a fifth voltage and said second voltages to said first and second conduction terminals and said control terminal predetermined to remove a charge from said floating gate region through said first conduction terminal;

first selecting means responsive to an address signal for selectively supplying said first voltage to one of said plurality of bit lines in a write mode of operation and selectively supplying said fourth voltage to one of said plurality of bit lines in a selective erasing mode of operation, second selecting means responsive to said address signal for selectively supplying said third voltage to one of said plurality of word lines in said write mode of operation and selectively supplying said second and fifth voltages to said plurality of word lines in said selective erasing mode of operation, and a source voltage circuit for respectively supplying said second and fifth voltages to said second conduction terminals in said write and selective erasing modes of operation, said second voltage being less than said first and fifth voltages and said third and fourth voltages each being greater than said second voltage.

7. The non-volatile semiconductor memory device according to claim 6, wherein said charge is stored on said floating gate region by hot electron injection in response to said respective applications of said first, second and third voltages to said first and second conduction terminals and said control terminal.

8. The non-volatile semiconductor memory device according to claim 6 wherein said first voltage is intermediate said second and third voltages.

9. A non-volatile semiconductor memory device comprising:

a plurality of memory cells arranged in a matrix of rows and columns, each having a source electrode, a drain electrode, a floating gate electrode and a control electrode;

a plurality of word lines arranged in rows, each word line connected to said control electrodes of said plurality of memory cells arranged in the corresponding row;

a plurality of bit lines arranged in columns, each bit line connected to said drain electrodes of said plurality of memory cells arranged in the corresponding columns;

a source electrode line connected to said source electrodes of said plurality of memory cells;

a word line voltage applying means for applying a first voltage to a selected word line and for applying a second voltage, which is higher than said first voltage to non-selected word lines in an erase mode;

a bit line voltage applying means for applying a third voltage, which is higher than said second voltage, to a selected bit line and for applying a fourth voltage, which is lower than said third voltage, to non-selected bit lines or maintaining said non-selected bit lines in an electrically floating gate in said erase mode; and a source electrode line voltage applying means for applying a fifth voltage, which is lower than said third voltage, to said source electrode line or for maintaining said source electrode line in an electrically floating state in said erase mode.

10. The non-volatile semiconductor memory device according to claim 9 wherein said first voltage and said fourth voltage are ground potential and said second voltage is equal to said fifth voltage.

11. A non-volatile semiconductor memory device comprising:

a plurality of memory cells arranged in a matrix of rows and columns, each having a source electrode, a drain electrode, a floating gate electrode and a control electrode, said memory cell array divided into a plurality of memory cell groups in a direction of columns;

a plurality of word lines arranged in rows, each word line connected to said control electrodes of said plurality of memory cells arranged in the corresponding row;

a plurality of bit lines arranged in columns, each bit line connected to said drain electrodes of said plurality of memory cells arranged in the corresponding columns;

a source electrode line connected to said source electrodes of said plurality of memory cells;

a word line voltage applying means for applying a first voltage to a selected word line and for applying a second voltage, which is higher than said first voltage to non-selected word lines in an erase mode;

a bit line voltage applying means having a plurality of bit line voltage applying blocks, each block provided in the corresponding memory cell group and for applying a third voltage, which is higher than said second voltage, to a selected bit line and for applying a fourth voltage, which is lower than said third voltage, to non-selected bit lines or maintaining said non-selected bit lines in an electrically floating state in said erase mode; and a source electrode line voltage applying means for applying a fifth voltage, which is lower than said third voltage, to said source electrode line or for maintaining said source electrode line in an electrically floating state in said erase mode.

12. The non-volatile semiconductor memory device according to claim 11 wherein said first voltage and said fourth voltage are ground potential and said second voltage is equal to said fifth voltage.

13. A method of erasing data of a non-volatile semiconductor memory device comprising memory cells arranged in a plurality of rows and columns, a plurality of word lines provided corresponding to said plurality of rows, and a plurality of bit lines provided corresponding to said plurality of columns, each of said plurality of memory cells including a field effect semiconductor device having a first conduction terminal connected to a corresponding bit line, a control terminal connected to a corresponding one of the word line, a floating gate region for storing electric charges and a second conduction terminal, the method comprising the steps of:

selecting one of said plurality of bit lines in response to an address signal, selecting one of said plurality of word lines in response to said address signal, and supplying a voltage across said selected bit line and said selected word line whereby said electric charges are discharged from said floating gate region of one of said memory cells having said first conduction terminal and said control terminal respectively connected to said selected bit line and said selected word line.

* * * * *